(12) United States Patent
Xia

(10) Patent No.: US 10,231,326 B2
(45) Date of Patent: Mar. 12, 2019

(54) FLEXIBLE PRINT CIRCUIT BOARD AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Long Xia, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 263 days.

(21) Appl. No.: 14/361,061

(22) PCT Filed: Mar. 29, 2013

(86) PCT No.: PCT/CN2013/073499
§ 371 (c)(1),
(2) Date: May 28, 2014

(87) PCT Pub. No.: WO2014/127557
PCT Pub. Date: Aug. 28, 2014

(65) Prior Publication Data
US 2016/0014888 A1    Jan. 14, 2016

(30) Foreign Application Priority Data
Feb. 25, 2013   (CN) .......................... 2013 1 0059149

(51) Int. Cl.
*H05K 1/02* (2006.01)
*H01L 23/498* (2006.01)
(Continued)

(52) U.S. Cl.
CPC ....... *H05K 1/0271* (2013.01); *H01L 23/4985* (2013.01); *H05K 1/028* (2013.01);
(Continued)

(58) Field of Classification Search
CPC ... G02F 1/13306; G02F 1/1303; H05K 3/281; H01L 2924/01078; G06F 1/1616; G06F 1/1683
(Continued)

(56) References Cited

U.S. PATENT DOCUMENTS 5,990,553 A * 11/1999 Morita ................... H01L 23/13
257/699
6,198,160 B1 * 3/2001 Yamaguchi ......... H01L 23/4951
257/673
(Continued)

FOREIGN PATENT DOCUMENTS

CN    1864095 A    11/2006
CN    201869434 A    6/2011
(Continued)

OTHER PUBLICATIONS

International Preliminary Report on Patentability dated Aug. 25, 2015; PCT/CN2013/073499.
(Continued)

*Primary Examiner* — Courtney L Smith
*Assistant Examiner* — Jessey R Ervin
(74) *Attorney, Agent, or Firm* — Ladas & Parry LLP

(57) ABSTRACT

A flexible printed circuit board and a display device are disclosed by embodiments of the invention. The flexible printed circuit board has one or more waveform structures disposed on its cross section.

15 Claims, 2 Drawing Sheets

(51) Int. Cl.
  *H05K 1/18* (2006.01)
  *H05K 5/00* (2006.01)
  *H05K 3/28* (2006.01)
(52) U.S. Cl.
  CPC .......... *H05K 1/0281* (2013.01); *H05K 1/181* (2013.01); *H05K 1/189* (2013.01); *H05K 5/0017* (2013.01); *H01L 2924/0002* (2013.01); *H05K 3/284* (2013.01)
(58) Field of Classification Search
  USPC ................... 349/58, 139–143, 147; 353/119; 361/679.01–679.02, 679.21, 679.26, 361/679.27, 679.28, 748–751, 755, 780; 174/254–257, 260–261, 263, 268
  See application file for complete search history.

(56) References Cited

U.S. PATENT DOCUMENTS

| | | | | |
|---|---|---|---|---|
| 7,606,049 | B2* | 10/2009 | Goodwin | G06F 1/184 257/678 |
| 8,748,229 | B2* | 6/2014 | Nishimura | H01L 21/568 257/686 |
| 2002/0093089 | A1* | 7/2002 | Lu | H01L 23/5389 257/700 |
| 2007/0116932 | A1* | 5/2007 | Van Der Tempel | G02F 1/133305 428/172 |

FOREIGN PATENT DOCUMENTS

| | | | | |
|---|---|---|---|---|
| JP | 0548218 | A | * 2/1993 | ........... H05K 1/0393 |
| JP | 0548218 | A | 2/1993 | |

OTHER PUBLICATIONS

First Chinese Office Action Appln. No. 201310059149.2; dated Jan. 16, 2015.

International Search Report dated Aug. 11, 2013; PCT/CN2013/073499.

* cited by examiner

FLEXIBLE PRINT CIRCUIT BOARD AND DISPLAY DEVICE

FIELD OF THE ART

Embodiments of the invention relate to a flexible print circuit board and a display device.

BACKGROUND

A flexible printed circuit board for COF (Chip On Film) is an important component connected with the display panel in a thin film display device. As illustrated in FIG. 1, a flexible printed circuit board comprises a base layer A, a conductive layer B, a solder resist layer (SR layer) C and an IC component D; surfaces of all film layers is designed to be planar, with the conductive layer B disposed between the base layer A and the SR layer. When a module is subjected to an anti-vibration test, a vibration test and transportation, a display panel may be easily vibrated as a gap may exist between the display panel and a housing, thus leading to deformation of the flexible printed circuit board. With such a configuration, the flexible printed circuit board is not effectively buffered and protected when being twisted and deformed by an external force, which will easily lead to breakage of the conductive layer of the flexible printed circuit board and abnormity 1 in input signal of panel, thereby making the possibility of defects high.

In a conventional flexible display device, a planar flexible printed circuit board is generally used. When being used, the flexible display device is often bent and affected by external force (such as tension and pressure) due to its speciality and functionality. A planar flexible printed circuit board can not effectively buffer the external force. Moreover, the flexible display device after being repeatedly bend can easily cause defects, which will affect the quality and life time of the flexible display device.

SUMMARY

An embodiment of the invention provides a flexible printed circuit board comprising one or more waveform structures disposed on a cross section thereof.

Another embodiment of the invention provides a display device comprising the above flexible printed circuit board.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

DETAILED DESCRIPTION

In the following, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

One of the technical problems to be solved by embodiments of the invention is to provide a flexible printed circuit board and a display device, which are capable of providing a self-protection function and a buffer function when subjected to an external force, so as to prevent the conductive layer from being broken or deformed. It can thus improve the breakage resistance and adaptability of the device; thereby effectively protect the flexible printed circuit board and the display device.

An embodiment of the invention provides a flexible printed circuit board, the flexible printed circuit board has a waveform structure disposed on its cross section. Furthermore, a protection layer covers a surface of the flexible printed circuit board. The waveform structure is configured for providing buffer when the flexible printed circuit board is subjected to an external force.

As an example, the waveform structure is distributed according to force applied to a flexible printed circuit board, amplitude and wavelength of the waveform structure are determined according to the force applied to the flexible printed circuit board.

In a waveform structure, a structure between two adjacent peaks or two adjacent troughs defines a wave structure unit. The waveform structure for example comprises at least one wave structure unit.

As an example, when the waveform structure comprises two or more wave structure units, the two or more wave structure units can be continuous or discontinuous.

As an example, a shape of the wave structure unit is a U shape, a V shape or a square.

When the flexible printed circuit board provided by the embodiment of the invention is acted on by an external force, the waveform structure therein can be extended and deformed, thereby buffering the external force. When the waveform structure is distributed according to the force acting on the flexible printed circuit board, it can make better improvement with respect to the external force, thereby effectively protecting the conductive layer of the flexible printed circuit board, preventing the conductive layer from being broken or deformed, and improving the breakage resistance and adaptability of the device. Furthermore, the protection layer disposed on the flexible printed circuit board can protect the flexible printed circuit board.

Figure 1:
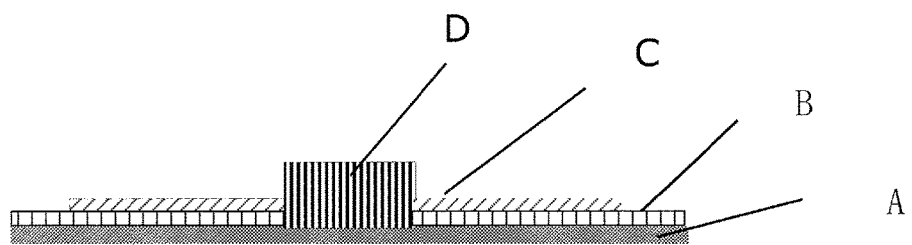
FIG. 1 schematically illustrates a cross section of a conventional flexible printed circuit board.
Figure 2:
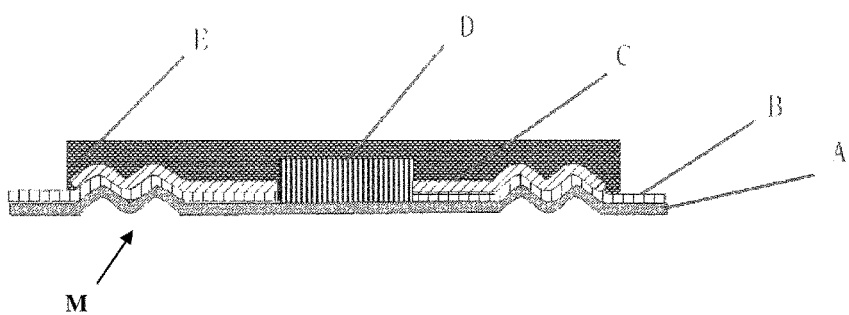
FIG. 2 schematically illustrates a cross section of a flexible printed circuit board in accordance with an embodiment of the inventions.

As illustrated in FIG. 2, a flexible printed circuit board for COF in accordance with an embodiment of the invention comprises: a base layer A and a conductive layer B formed above the base layer A. The base layer A is for example made of an insulation material; the conductive layer B is for example a wire pattern layer, and a semiconductor chip will be mounted thereon; the semiconductor chip to be mounted is for example an IC component D. The flexible printed circuit board provided by the embodiment of the invention can further comprise a solder resist layer (SR layer) C formed above the conductive layer B. The base layer A, the conductive layer B, the SR layer C and the IC component D are for example closely bonded. A waveform structure M may be formed at the same position on the base layer A, the conductive layer B and the SR layer C.

In the embodiment, two waveform structures M are symmetrically disposed at two opposite sides of the IC component D to be mounted. Each waveform structure M comprises for example two continuous wave structure units. The locations of the waveform structures M can be determined according to the force acting on the flexible printed circuit board.

As an example, the waveform structure is disposed for example to surround the IC component to be mounted in a plan view. The waveform structure comprises for example a plurality of continuous wave structure units on a cross section; each of the wave structure units is shown as for example a ring in the plan view. With such a configuration, it may provide buffer and protection for the flexible printed circuit board at various directions. Moreover, multiple continuous wave structure units on the cross section can provide better and more stable protection, thereby improving the overall breakage resistance and adaptability of the flexible printed circuit board.

Figure 3:
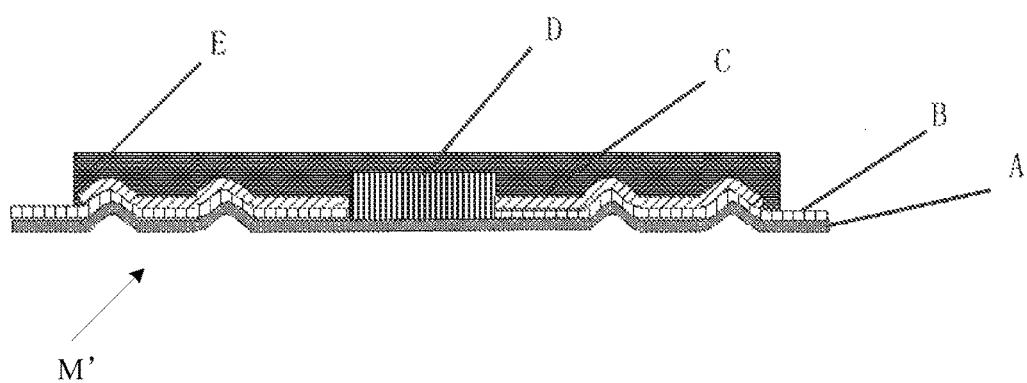
FIG. 3 schematically illustrates a cross section of a flexible printed circuit board in accordance with an embodiment of the invention.

As another example, referring to FIG. 3, the waveform structure M' comprises for example a plurality of discontinuous wave structure units on the cross section. Such a waveform structure can buffer the external force step by step, making the impact from the external force even smaller.

In an embodiment of the invention, the amplitude and the wavelength of the waveform structure is determined according to the force acting on the flexible printed circuit board. Those skilled in the art can make various modifications as necessary.

In an embodiment of the invention, the shape of the wave structure unit is a U shape, a V shape or a square, according to various cases.

The flexible printed circuit board can be further covered with the protection layer E.

Various modifications and variations can be made base on the above embodiments of the invention.

As an example, the waveform structure is disposed on at least one of the base layer, the conductive layer and the SR layer. For example, the waveform structure is disposed on the base layer of the flexible printed circuit board, i.e., a surface (such as an upper surface) of the base layer having the conductive layer formed thereon has waveform protrusions. The conductive layer and/or the SR layer are formed on such a base layer, allowing the conductive layer and/or the SR layer to have waveform protrusions overlapping with the waveform protrusions in the base layer. The flexible printed circuit board with such a configuration can provide a good buffer function.

As another example, the base layer is a planar structure, and a waveform protrusion is formed on the upper surface of the conductive layer, and a waveform protrusion is accordingly formed on the SR layer.

As another example, the base layer and the conductive layer are planar structures, while the waveform protrusion is only formed on the upper surface of the SR layer.

The configurations of the flexible printed circuit boards provided by embodiments of the invention are not limited to those described above situation, as long as the waveform structure is disposed in the flexible printed circuit board, thereby protecting the flexible printed circuit board, preventing the conductive layer from being broken and deformed. Such variations are all within the protection of the invention.

The inventors performed an anti-bending test on the flexible printed circuit board with and without the improvement, wherein the flexible printed circuit board without the improvement is a flexible printed circuit board having the base layer, the conductive layer and the SR layer which are all of planar structure, while the flexible printed circuit board with the improvement is the flexible printed circuit board having the waveform structure as provided by the embodiment of the invention.

The test conditions are as follows: tensile weigh being 200 gram, a bending angle being 90 degrees, a bending velocity being 15 rpm, a bending radius being 0.5 mm. The test results are shown in Table 1.

TABLE 1

| | | | Number of bending test | | |
| Model | Manufacturer | Wire width in conductive layer | without improvement | with improvement | Improvement effect |
| --- | --- | --- | --- | --- | --- |
| NT39992-C1279 | Manufacturer X | 21.3 | 98 | 392 | 306% |
| HX8157-CCY0H | Manufacturer Y | 21.3 | 87 | 386 | 343% |

The test is performed on two types of flexible printed circuit board models. The two types of the flexible printed circuit boards without the improvement withstands 98 and 87 bending tests respectively before fault occurrence, while the two types of the flexible printed circuit boards with the improvement withstands 392 and 386 bending tests respectively before fault occurrence. Therefore, the bending resistances of the two types of the flexible printed circuit boards with the improvement are respectively improved by 306% and 343% comparing with the two types of the flexible printed circuit boards without the improvement.

The test result shows that the bending resistances of the flexible printed circuit board with the improvement is improved by more than 300% comparing with the flexible printed circuit board without the improvement.

Moreover, statistics is made on the non-defective rate of the flexible printed circuit boards with and without the improvement, wherein the flexible printed circuit board without the improvement is a flexible printed circuit board having the base layer, the conductive layer and the SR layer which are all of planar structure, while the flexible printed circuit board with the improvement is the flexible printed circuit board having the waveform structure as provided by the embodiment of the invention. The statistic result is shown in Table 2.

TABLE 2

|  | Without the improvement | | | With the improvement | | |
| --- | --- | --- | --- | --- | --- | --- |
| Batch No. | number of inputs (pcs) | number of defective (pcs) | defect rate (PPM) | number of inputs (pcs) | number of defective (pcs) | defect rate (PPM) |
| 1 | 92462 | 487 | 5267 | 16,512 | 1 | 61 |
| 2 | 117464 | 454 | 3865 | 2,000 | 1 | 500 |
| 3 | 137394 | 600 | 4369 | 800 | 0 | 0 |
| 4 | 175953 | 300 | 1705 | 5000 | 1 | 200 |
| result | 523273 | 1841 | 3518 | 24312 | 3 | 124 |

Statistics are made on products of different batches. The table lists the number of input, the number of defective and the defect rates for products of batches 1 to 4 with and without the improvement. The results shows that the defect rate of the product is significantly reduced comparing with those without the improvement, which can increase the reliability of the products.

Figure 4:
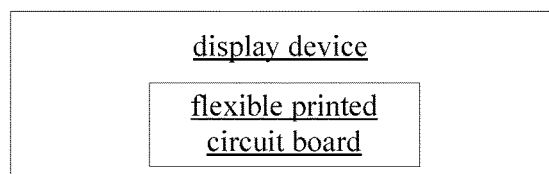
FIG. 4 schematically illustrates a block diagram of display device including a flexible printed circuit board.

An embodiment of the invention further provides a display device; referring to FIG. 4, the display device comprises the above flexible printed circuit board. As the flexible printed circuit board provided by the embodiment of the invention has good external force-resistance and excellent bending resistance, the display device also has external-force-resistance and excellent bending resistance, thereby improving the quality and lifetime of the display device.

Based on the above descriptions, the embodiments of the invention can provide at least the following structures:

(1) A flexible print circuit board comprising one or more waveform structures disposed on a cross section thereof.

(2) The flexible printed circuit board of (1), comprising: a base layer and a conductive layer disposed on a side of the base layer, a semiconductor chip to be mounted on the conductive layer, wherein the one or more waveform structures are disposed on a cross section of at least one of the base layer and the conductive layer.

(3) The flexible printed circuit board of (2), wherein in the case that the waveform structures are disposed on both the base layer and the conductive layer, the waveform structures disposed on the base layer and the conductive layer overlap each other.

(4) The flexible printed circuit board of (2) or (3), further comprising a solder resist layer, wherein the one or more waveform structures are disposed on a cross section of at least one of the base layer, the conductive layer and the solder resist layer.

(5) The flexible printed circuit board of (4), wherein in the case that the waveform structures are disposed on the base layer and the conductive layer, the waveform structures disposed on the base layer, the conductive layer and the solder resist layer overlap each other.

(6) The flexible printed circuit board any one of (1) to (5), wherein the waveform structures are disposed to surround the semiconductor chip to be mounted.

(7) The flexible printed circuit board of any one of (1) to (5), wherein two waveform structures are symmetrically disposed at two sides of the semiconductor chip to be mounted.

(8) The flexible printed circuit board of any one of (1) to (7), wherein the waveform structure comprises one or plural wave structure units, and the plural wave structure units are continuous or discontinuous when the waveform structure comprises plural wave structure units.

(9) The flexible printed circuit board of (8), wherein a shape of the wave structure unit is a U shape, a V shape or a square.

(10) The flexible printed circuit board of any one of (1) to (9), wherein a surface of the flexible printed circuit board is covered with a protection layer.

(11) A display device comprising the flexible printed circuit board of any one of (1) to (10).

Though the invention is described in detail in the above with reference to general description and detailed embodiments, modifications and variants are possible obvious to a person of ordinary skills in the art may be made based on the invention. The modifications and variants all belong to the scopes of the invention without departing from the spirits of the invention.

The invention claimed is:

1. A flexible print circuit board, on a cross section thereof, comprising at least two waveform structures disposed at two opposite sides of a flat portion, wherein, the flat portion is configured for positioning a semiconductor chip to be mounted, each of the at least two waveform structures comprises a plurality of wave structure units on the cross section which are substantially equal in width in a direction paralleled with the flat portion, the plurality of discontinuous wave structure units are configured to buffer an external force, wherein, at a same side of the semiconductor chip to be mounted, the width of each of the wave structure units is smaller than a width of a portion of the flat portion configured to be uncovered by the semiconductor chip to be mounted, in the direction parallel with the flat portion, wherein, surface of the flat portion facing away from the semiconductor chip to be mounted is located in a plane, a part of each of the wave structure units is at a side of the plane opposite to the semiconductor chip to be mounted.

2. The flexible printed circuit board of claim 1, comprising: a base layer and a conductive layer disposed on a side of the base layer, wherein, the semiconductor chip to be mounted is located on the conductive layer, wherein the one or more waveform structures are disposed on a cross section of at least one of the base layer and the conductive layer.

3. The flexible printed circuit board of claim 2, wherein in the case that the waveform structures are disposed on both the base layer and the conductive layer, the waveform structures disposed on the base layer and the conductive layer overlap each other.

4. The flexible printed circuit board of claim 2, further comprising a solder resist layer, wherein the one or more waveform structures are disposed on a cross section of at least one of the base layer, the conductive layer and the solder resist layer.

5. The flexible printed circuit board of claim 4, wherein in the case that the waveform structures are disposed on the base layer, the conductive layer and the solder resist layer, the waveform structures disposed on the base layer, the conductive layer and the solder resist layer overlap each other.

6. The flexible printed circuit board of claim 1, wherein two waveform structures are symmetrically disposed at two sides of the semiconductor chip to be mounted.

7. The flexible printed circuit board of claim 1, wherein a shape of the wave structure unit is a U shape, a V shape or a square.

8. The flexible printed circuit board of claim 1, wherein a surface of the flexible printed circuit board is covered with a protection layer.

9. A display device comprising the flexible printed circuit board of claim 1.

10. The flexible printed circuit board of claim 3, further comprising a solder resist layer, wherein the one or more waveform structures are disposed on a cross section of at least one of the base layer, the conductive layer and the solder resist layer.

11. The flexible printed circuit board of claim 10, wherein in the case that the waveform structures are disposed on the base layer, the conductive layer and the solder resist layer, the waveform structures disposed on the base layer, the conductive layer and the solder resist layer overlap each other.

12. The flexible printed circuit board of claim 2, wherein the waveform structures are disposed to surround the semiconductor chip to be mounted.

13. The flexible printed circuit board of claim 3, wherein the waveform structures are disposed to surround the semiconductor chip to be mounted.

14. The flexible printed circuit board of claim 2, wherein the at least two waveform structures are symmetrically disposed at the two opposite sides of the semiconductor chip to be mounted respectively.

15. The flexible printed circuit board of claim 3, wherein the at least two waveform structures are symmetrically disposed at the two opposite sides of the semiconductor chip to be mounted respectively.

* * * * *